June 7, 1955 H. M. SCHMIDT 2,710,346

HETERODYNE MIXER STAGE

Filed May 2, 1951

INVENTOR
H.M. SCHMIDT
By Philip M. Bolton
Attorney 2,710,346

HETERODYNE MIXER STAGE

Hübert M. Schmidt, Pforzheim, Germany, assignor to International Standard Electric Corporation, New York, N. Y., a corporation of Delaware Application May 2, 1951, Serial No. 224,086

Claims priority, application Germany May 2, 1950

2 Claims. (Cl. 250—20)

Figures 1, 2:
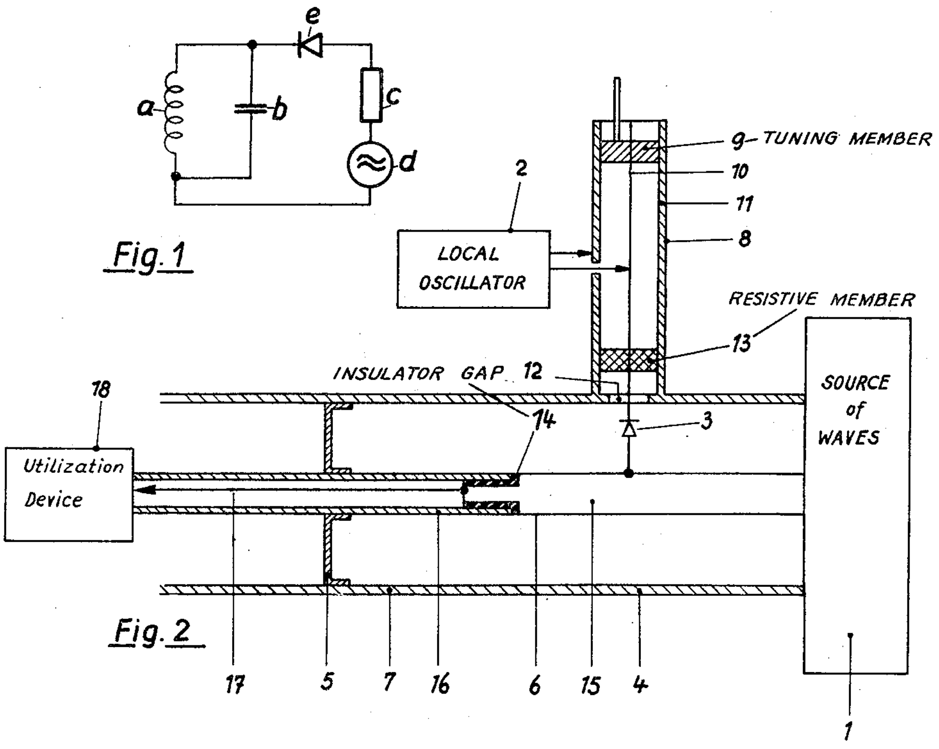

The present invention relates to a heterodyne mixer stage for electric waves, such as for example in the decimeter range, at least one of which is tunable by a transmission line arrangement, such as a coaxial line or cavity resonator.

The essential requirements imposed on such a heterodyne mixer are that the inputs must be tuned as independently as possible from each other and that a minimum amount of the received power should enter the oscillator input, in order to prevent unnecessary losses in the received signal. Both requirments are to be regarded as having been met when the coupling between the local oscillator and the received signal inputs has been reduced to a minimum. Known arrangements that meet these requirements are the push-pull heterodyne oscillators. Their main drawback in the case of decimeter waves is that in practice it is difficult to maintain perfect balance when tuning over a rather wide frequency band. In other known arrangements the detector is placed at the end of a line over which the received signal is led in through tuning means. The oscillator output is fed in through a tap on this line. The necessary decoupling of the inputs is effected either by locating the point at which the oscillator output is fed in at a voltage node of the standing wave on the line carrying the received signal, or by giving the oscillator lead-in line a high ohmic resistance by suitable tuning, e. g., by changing its length, as seen from the feed point. Both arrangements have this common drawback that when the received signal frequency is changed, the location of the feed point or the length of the input line must be altered. The necessity of tuning the oscillator frequency to the received signal frequency is also a disadvantage when oscillators with lead-in cables terminated with an ohmic resistance are used, since faulty tuning of the oscillator frequency causes a loss of the received signal power in the oscillator terminating resistance. A particular disadvantage is that the oscillator must be tuned in addition to tuning for the receiving frequency.

According to the invention, these difficulties can be overcome in large measure by placing the detector directly in series with the terminals of the oscillator line and of the received frequency tuner instead of at the end of a line carrying both the oscillator and the received frequencies, as is done in the above-mentioned arrangement.

According to another feature of the present invention the transmission line for the received frequency may be a tuned coaxial line with the inner conductor being interrupted by a capacitive gap whose reactance is relatively low for the received and local oscillator frequency but whose reactance is high for the intermediate or beat frequency. The inner conductor on one side of the gap may be hollow, and the intermediate frequency output is obtained by a direct connection to said hollow portion of the inner conductor, and a connection formed by a lead passing through, and insulated from said inner hollow portion, and connected to the other portion of the inner conductor on the other side of the gap.

The above-mentioned and other features and objects of this invention and the manner of attaining them will become more apparent and the invention itself will be best understood, by reference to the following description of an embodiment of the invention taken in conjunction with the accompanying drawings, wherein:

Fig. 1 is a schematic diagram of an equivalent arrangement showing the coupling of the tunable circuit for the received frequencies to the local oscillator by means of the rectifier; and Fig. 2 is a schematic and block diagram of a heterodyne mixer stage.

Referring now to the equivalent circuit of Fig. 1 there is applied to the equivalent tuned circuit *a*, *b* a wave of one frequency, such as a received frequency wave, which is to be mixed with the waves from a local oscillator whose internal resistance is designated by *c*, the oscillator being designated by *d*. The rectifier element *e* is the only coupling between the received frequency tuned circuit and the local oscillator. Thus the coupling between the local oscillator and the tuned circuit is reduced to the minimum required by the rectifier element. Excessive attenuation of the input circuit applying the wave to the tuned circuit *a*, *b*, which excessive attenuation may be caused by the high conductance of the rectifier *e*, can be minimized by decreasing the coupling between the input circuit and the tuned circuit *a*, *b*. It will thus be seen that the desired requirement set forth hereinbefore for such a mixer is substantially met.

Referring to an embodiment of the present invention, waves from a source 1 which are to be mixed with waves from a local oscillator 2, the frequency of either of these, or both of these, sources 1 and 2 being in the decimeter range, are mixed in the mixer stage by means of a rectifier 3. The received frequency waves from source 1 are applied to a tunable resonant circuit in the form of a coaxial line 4 which is tunable by any suitable means such as the usual shorting piston 5 connected between the inner conductor 6 and the outer conductor 7 of said coaxial line. The coupling between source 1 and line 4 may be varied in any usual manner (not shown). The rectifier 3 is mounted within said outer conductor 7. The local oscillator energy from local oscillator 2 is fed to the mixer via a second line hereinafter referred to as the oscillator line, such as the coaxial line 8, tuned by suitable means such as the usual piston 9 which shorts the inner conductor 10 to the outer conductor 11 either galvinically or by means of a capacitive short. One end of the outer conductor 11 of the oscillator line 8 terminates at, and is connected to, the outer conductor 7 of line 4. The inner conductor 10 of the oscillator line 8 passes through an opening 12 in the outer conductor 7 of coaxial line 4 and is connected within said outer conductor 7 to one end of the eectifier 3, the other end of the rectifier 3 being connected to the inner conductor 6 of coaxial line 4. The end of oscillator line 8 adjacent coaxial line 4 is terminated by an impedance-matching resistance in the form of a resistance element 13 connected between the inner conductor 10 and outer conductor 11.

From the foregoing description it will be seen that the oscillator line 8 can be tuned separately from the tuning of the coaxial line 4 and without affecting the position of the terminating resistance 13. Furthermore it will be seen that the coupling between the local oscillator and the source 1 is via the rectifier 3 as shown in the equivalent diagram of Fig. 1.

Since a high-frequency voltage (from source 1 or local oscillator 2) is applied to both terminals of rectifier 3, the intermediate frequency cannot be taken directly from them. To derive the intermediate frequency output the inner conductor 6 of coaxial line 4 is provided with a non-conductive gap 14 so as to separate the inner conductor into two portions 15 and 16. The non-conductive gap may consist of an insulating member separating portions 15 and 16. The capacitance across said gap has relatively low reactance at the frequencies of the waves from source 1 or the waves from local oscillator 2. It has however a relatively high reactance at the intermediate frequency. The portion 16 of inner conductor 6 is preferably made hollow and a conductive lead 17 passes through said hollow and is connected to the portion 15 of inner conductor 6. Said portion 15 may be a solid conductor. Lead 17 therefore provides one side of the output of the intermediate frequencies and the other side thereof is provided by a connection to the portion 16 of inner conductor 6. These two output sides are connected to any suitable utilization device 18. Conductors 16 and 17 may operate as a coaxial transmission line if the intermediate frequencies are sufficiently high to warrant this use.

While I have described above the principles of my invention in connection with specific apparatus, it is to be clearly understood that this description is made only by way of example and not as a limitation to the scope of my invention.

What is claimed is:

1. A heterodyne mixer arrangement comprising a source of received waves, a local oscillator providing local oscillator waves which are to be mixed with said received waves, a tunable coaxial line coupled at one end to said source, a second coaxial line coupled to said local oscillator, the outer conductor of said second line being connected to and terminating at a given point on the outer conductor of said tunable line, a rectifier within said tunable line, means connecting one end of said rectifier to the inner conductor of said tunable line, means connecting the other end of said rectifier to the inner conductor of said second line, means providing a capacitive gap between two portions of the inner conductor of said tunable line, one of said portions having an opening therein, and a conductive lead passing through said opening of said one portion and being connected at one end to the other of said portions, to derive an intermediate frequency from inside said tunable lines.

2. A heterodyne mixer arrangement according to claim 1 further including a resistive element adjacent said given end of said second line terminating said line in its characteristic impedance, and separate means for tuning said second line.

References Cited in the file of this patent

UNITED STATES PATENTS

| | | |
|---|---|---|
| 2,455,657 | Cork et al. | Dec. 7, 1948 |
| 2,547,412 | Salisbury | Apr. 3, 1951 |
| 2,567,208 | Horvath | Sept. 11, 1951 |
| 2,576,481 | Rodwin | Nov. 27, 1951 |
| 2,616,037 | Wheeler | Oct. 28, 1952 |

OTHER REFERENCES

Edwards: Microwave Converters, Proc. IRE, vol. 35, No. 11, November 1947, pages 1181 to 1191.